United States Patent [19]
Berar

[11] Patent Number: 6,040,700
[45] Date of Patent: Mar. 21, 2000

[54] SEMICONDUCTOR TESTER SYSTEM INCLUDING TEST HEAD SUPPORTED BY WAFER PROBER FRAME

[75] Inventor: Andrei Berar, Campbell, Calif.

[73] Assignee: Credence Systems Corporation, Fremont, Calif.

[21] Appl. No.: 08/929,502

[22] Filed: Sep. 15, 1997

[51] Int. Cl.[7] .................................................. G01R 31/02
[52] U.S. Cl. ............................................ 324/754; 324/758
[58] Field of Search ...................................... 324/754, 758, 324/761, 762, 755, 756, 757, 765

[56] References Cited

U.S. PATENT DOCUMENTS

| | | | |
|---|---|---|---|
| 5,754,057 | 5/1998 | Hama et al. | 324/754 |
| 5,804,983 | 9/1998 | Nakajima et al. | 324/754 |
| 5,821,763 | 10/1998 | Beaman et al. | 324/754 |

*Primary Examiner*—Jay Patidar
*Attorney, Agent, or Firm*—Smith-Hill and Bedell

[57] ABSTRACT

In a semiconductor tester system including a wafer prober, the entire weight of the test head assembly is carried by the wafer prober frame. In one embodiment, a probe card is releasably attached to the test head assembly through a ring carrier and the probe tips are planarized during initial installation. In another embodiment, the probe card is attached directly to the test head assembly and the probe tips are planarized each time the probe card is changed.

14 Claims, 2 Drawing Sheets

SEMICONDUCTOR TESTER SYSTEM INCLUDING TEST HEAD SUPPORTED BY WAFER PROBER FRAME

BACKGROUND OF THE INVENTION

This invention relates to a semiconductor tester system for testing integrated circuit devices in wafer form.

FIG. 3 of the drawings illustrates a semiconductor tester system of generally conventional structure. Such a tester system is typically located in a clean room. The tester system includes a wafer prober 10 having a frame 12 in which a vacuum chuck 14 is mounted for movement along two horizontal axes (X and Y) and a vertical axis (Z). A ring carrier 18, which is a metal ring equipped with a latching mechanism 20, is supported above the prober frame by a ring carrier support structure 22, which typically includes three angularly spaced support points. For the sake of simplicity of illustration, the two support points shown in FIG. 3 are illustrated as if they were at an angular spacing of 180° although they would not in fact generally be at an angular spacing of 180°. The ring carrier 18 is latched to the support structure 22.

A generally annular probe card stiffener 26 is provided at its outer periphery with latch elements 28 for engagement with the latching mechanism 20 of the ring carrier 18. A generally annular probe card 30 rests on the probe card stiffener. The probe card has an outer area at which contact pads are exposed at the upper surface of the probe card and it has an inner open area from which probe tips project downward toward the vacuum chuck 14. The probe tips are connected to the contact pads of the probe card by conductive traces of the probe card.

A test head assembly 32 is positioned above the ring carrier 18. The test head assembly is in contact with the ring carrier 18 and is latched thereto. The test head assembly typically has a mass of at least 150 kg. Most of the weight of the test head assembly is carried by a manipulator 34, but a significant part of the weight of the test head assembly is carried by the ring carrier 18.

When the latch elements 28 of the probe card stiffener 26 are engaged with the latching mechanism 20, the contact pads of the probe card engage spring-loaded contact elements 36 which project downward from the test head assembly and provide electrical connection between the test head assembly and contact pads of the probe card.

For testing an integrated circuit device in wafer form, the wafer 40 is placed on the vacuum chuck 14 and is held in place by partial vacuum applied to the lower surface of the wafer. The vacuum chuck may be moved horizontally to position the contact pads of the wafer vertically below the probe tips and then moves upward and delivers the wafer to a test station in which the contact pads of the wafer engage the probe tips, for making electrical contact with the integrated circuit device, and stimulus and response signals are communicated between the test head and the wafer by way of the contact elements 36 and the conductive traces of the probe card.

It is important that the plane of the contact pads of the wafer 40 be parallel with the plane of the probe tips of the probe card 30 to ensure that the probe tips enter electrically conductive contact with all the pads of the wafer under test when the vacuum chuck is displaced to the test station. For this purpose, at least two of the support points of the ring carrier support structure 22 are individually adjustable in height for adjusting the orientation of the ring carrier 18 relative to the prober frame 12.

Because the weight of the test head assembly 32 is shared between the ring carrier 18 and the manipulator 34, vibration of the floor on which the prober frame and manipulator rest can lead to independent vibration of the test head assembly and ring carrier. Since the test head assembly is latched to the ring carrier, this independent vibration can cause distortion of the ring carrier. Further, the horizontal relative movement of the probe card and the wafer can lead to misalignment of the probe tips with respect to the pads of the device under test, impairing the accuracy of the test to a significant extent, and to erosion of the probe tips, reducing the useful life of the probe card. Moreover, the manipulator includes moving parts which shed debris, which is undesirable in a clean room environment.

SUMMARY OF THE INVENTION

In accordance with a first aspect of the invention there is provided a semiconductor tester for testing a semiconductor device in wafer form, comprising a wafer prober including a wafer prober frame, a chuck for holding a wafer under test and a displacement mechanism for displacing the chuck upward relative to the wafer prober frame toward a test station, a mechanical interface member, an interface member support structure mounted on the wafer prober frame for supporting the mechanical interface member, the interface member support structure being adjustable, whereby the orientation of the interface member relative to the prober frame can be adjusted, a test head having test head terminals distributed over a test face, a test head mounting structure to which the test head is attached, the test head mounting structure being supported by the wafer prober frame with the test face oriented toward the chuck and the entire weight of the test head being carried by the prober frame, a probe card, and a probe card latching mechanism for releasably attaching the probe card to the mechanical interface member at a location in which the probe card engages the test head terminals and the wafer under test engages the probe card when at the test station.

In accordance with a second aspect of the invention there is provided a semiconductor tester for testing a semiconductor device in wafer form, comprising a wafer prober including a wafer prober frame, a chuck for holding a wafer under test and a displacement mechanism for displacing the chuck upward relative to the wafer prober frame toward a test station, a test head having test head terminals distributed over a test face, a test head mounting structure to which the test head is attached and latched, the test head mounting structure being supported by the prober frame with the test face oriented toward the chuck and the entire weight of the test head being carried by the prober frame, a probe card, and a probe card latching mechanism for releasably attaching the probe card to the test head at a location in which the probe card engages the test head terminals and the wafer under test engages the probe card when at the test station.

In accordance with a third aspect of the invention there is provided a method of operating a semiconductor tester for testing a semiconductor device in wafer form, the semiconductor tester comprising a test head having test terminals distributed over a test face and a wafer prober including a wafer prober frame, a chuck for holding a wafer under test and a displacement mechanism for displacing the chuck upward relative to the prober frame, said method comprising supporting the test head over the chuck with the test face oriented toward the chuck and the entire weight of the test head carried by the wafer prober frame, securing a probe card at a location in which it engages the test terminals of the test head, positioning a wafer on the chuck, and displacing the chuck upward relative to the wafer prober frame to bring the wafer to a test station in which it engages the probe card.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
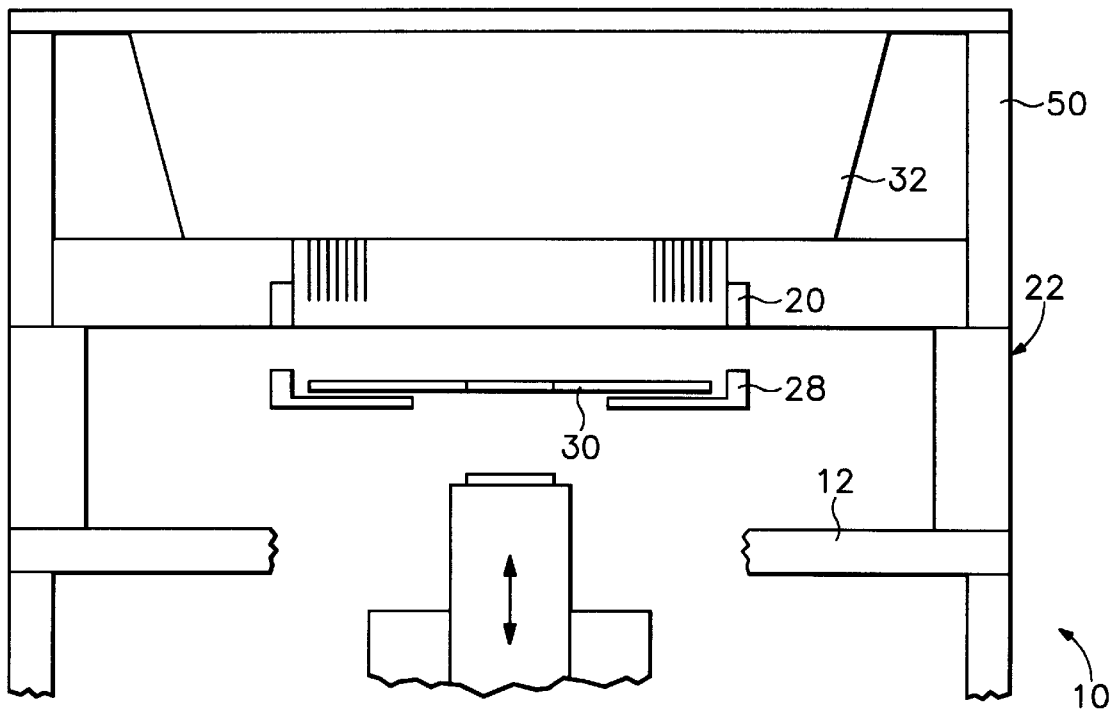
FIG. 1 is a partial sectional view in diagrammatic form of a first semiconductor tester system in accordance with the present invention.
Figure 3:
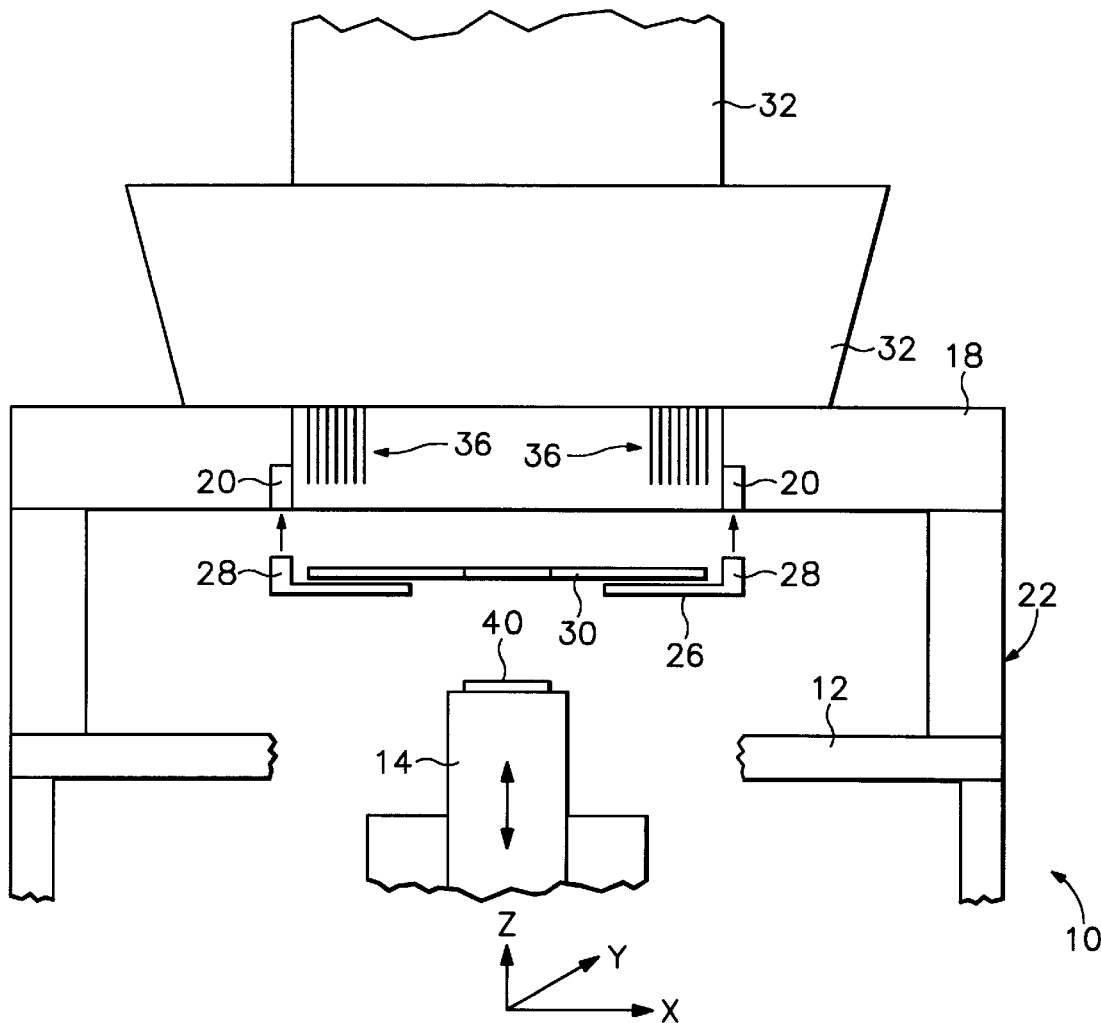
FIG. 3 is a partial sectional view in diagrammatic form of a semiconductor tester system in accordance with the prior art.

The tester system shown in FIG. 1 includes three angularly distributed legs 50 (only two of which are shown) which rest on the ring carrier support structure 22. Similarly to FIG. 3, the two legs 50 shown in FIG. 1 are illustrated as if they were at an angular spacing of 180° although they would not in fact generally be at an angular spacing of 180°. The entire weight of the test head assembly 32 is supported by the prober frame 12 through the legs 50 and the support structure 22; and the legs 50, which are rigidly attached to the test head assembly, are latched to the support structure 22 so that the test head assembly is fixed relative to the prober frame 12. During initial installation, the probe tips are planarized relative to the surface of the DUT by adjusting the two adjustable support points of the ring carrier support structure 22, and the adjustable support points are then locked. Since the test head assembly is not supported independently of the prober frame, the test head assembly does not vibrate independently of the prober frame when the floor on which the prober frame rests vibrates. Therefore the ring carrier is not distorted when the test head assembly 32 moves due to vibration of the floor on which the prober frame 12 rests. Further, there is no horizontal relative movement of the probe card and the vacuum chuck, such as would cause misalignment of the probe tips or erosion of the probe tips.

Since the tester system shown in FIG. 1 does not include a manipulator, there is a reduced level of generation of debris in the clean room.

Figure 2:
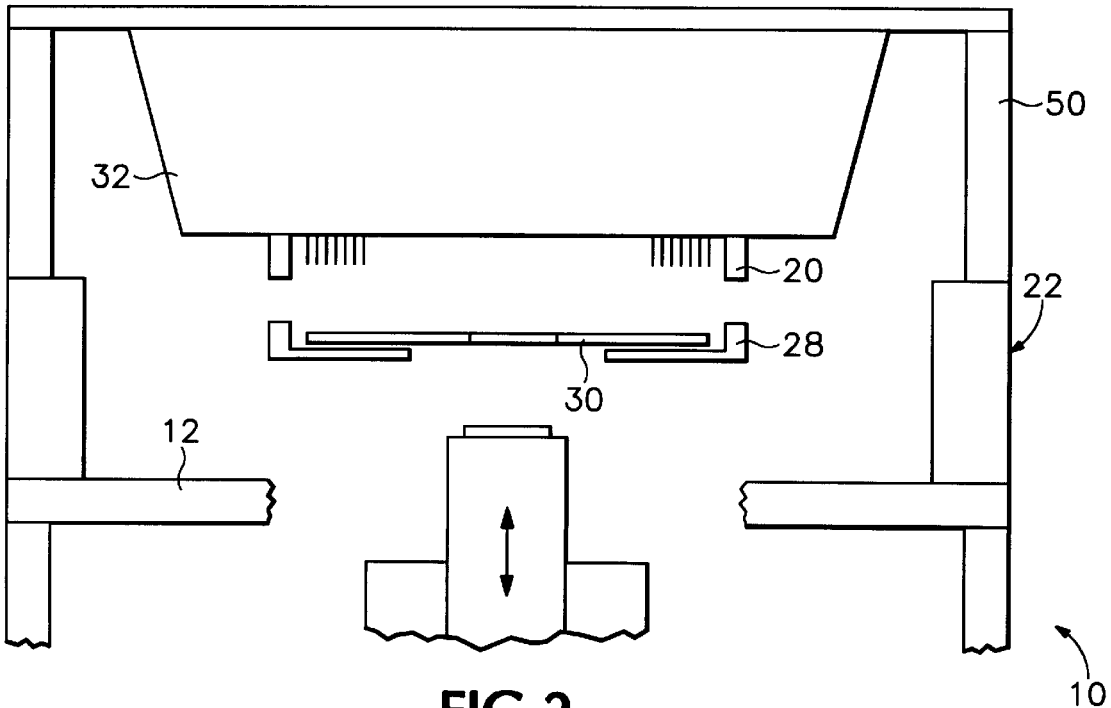
FIG. 2 is a similar view of a second tester system in accordance with the present invention.

In the tester system shown in FIG. 2, the ring carrier is omitted and the probe card latching mechanism 20 is attached to the test head assembly 32 itself. In this case, planarization of the probe tips relative to the surface of the DUT is accomplished by adjusting the orientation of the test head assembly each time the probe card is changed. An upward looking camera is placed on the chuck in lieu of the wafer and acquires an image of the probe tips. A video processor analyzes the image and determines the orientation of the plane of the probe tips relative to a reference plane. The video processor provides signals to the adjustable support points of the ring carrier support structure 22 for adjusting the orientation of the plane of the probe tips relative to the reference plane in order to planarize the probe tips with respect to the surface of the DUT. In this manner, the orientation of the test head assembly can be adjusted to achieve an optimum orientation for a particular probe card.

It will be appreciated that the invention is not restricted to the particular embodiment that has been described, and that variations may be made therein without departing from the scope of the invention as defined in the appended claims and equivalents thereof.

I claim:

1. A semiconductor tester for testing a semiconductor device in wafer form, comprising:

a wafer prober including a wafer prober frame, a chuck for holding a wafer under test and a displacement mechanism for displacing the chuck upward relative to the wafer prober frame toward a test station, a mechanical interface member, an interface member support structure mounted on the wafer prober frame for supporting the mechanical interface member, the interface member support structure being adjustable, whereby the orientation of the interface member relative to the prober frame can be adjusted, a test head having test head terminals distributed over a test face, a test head mounting structure to which the test head is rigidly attached, the test head mounting structure being fixed to and supported by the wafer prober frame, independently of the mechanical interface member, with the test face oriented toward the chuck and the entire weight of the test head being carried by the prober frame, a probe card, and a probe card latching mechanism for releasably attaching the probe card to the mechanical interface member at a location in which the probe card engages the test head terminals and the wafer under test engages the probe card when at the test station.

2. A semiconductor tester according to claim 1, comprising a probe card stiffener on which the probe card rests, and wherein the probe card latching mechanism comprises a first part attached to the mechanical interface member and a second part attached to the probe card stiffener and releasably engageable with the first part.

3. A semiconductor tester according to claim 1, wherein the interface member support structure comprises equiangularly spaced support legs mounted on the wafer prober frame and wherein at least two of the support legs are adjustable in height.

4. A semiconductor tester according to claim 1, wherein the test head mounting structure rests on the interface member support structure.

5. A semiconductor tester for testing a semiconductor device in wafer form, comprising:

a wafer prober including a wafer prober frame, a chuck for holding a wafer under test and a displacement mechanism for displacing the chuck upward relative to the wafer prober frame toward a test station, a test head having test head terminals distributed over a test face, a test head mounting structure to which the test head is rigidly attached and latched, the test head mounting structure being fixed to and supported by the prober frame with the test face oriented toward the chuck and the entire weight of the test head being carried by the prober frame, a probe card, and a probe card latching mechanism for releasably attaching the probe card to the test head at a location in which the probe card engages the test head terminals and the wafer under test engages the probe card when at the test station.

6. A semiconductor tester according to claim 5, comprising a probe card stiffener on which the probe card rests, and wherein the probe card latching mechanism comprises a first part attached to the test head and a second part attached to the probe card stiffener and releasably engageable with the first part.

7. A semiconductor tester according to claim 5, wherein the test head mounting structure comprises equiangularly spaced support legs mounted on the wafer prober frame and wherein at least two of the support legs are adjustable in height.

8. A method of operating a semiconductor tester for testing a semiconductor device in wafer form, the semiconductor tester comprising a test head having test terminals distributed over a test face and a wafer prober including a wafer prober frame, a chuck for holding a wafer under test and a displacement mechanism for displacing the chuck upward relative to the prober frame, said method comprising:

supporting the test head over the chuck with the test face oriented toward the chuck and the entire weight of the test head carried by the wafer prober frame, securing a probe card at a location in which it engages the test terminals of the test head, positioning a wafer on the chuck, and displacing the chuck upward relative to the wafer prober frame to bring the wafer to a test station in which it engages the probe card.

9. A method according to claim 8, comprising adjusting the orientation of the probe card relative to the wafer on the chuck.

10. A method according to claim 8, comprising latching the test head to the wafer prober frame.

11. A semiconductor tester for testing a semiconductor device in wafer form, comprising:

a wafer prober including a wafer prober frame, a chuck for holding a wafer under test and a displacement mechanism for displacing the chuck upward relative to the wafer prober frame toward a test station, a ring carrier, a ring carrier support structure mounted on the wafer prober frame for supporting the ring carrier, the ring carrier support structure being adjustable, whereby the orientation of the ring carrier relative to the prober frame can be adjusted, a test head having test head terminals distributed over a test face, a test head mounting structure to which the test head is rigidly attached, the test head mounting structure being fixed to and supported by the wafer prober frame, independently of the ring carrier, with the test face oriented toward the chuck and the entire weight of the test head being carried by the prober frame, a probe card, and a probe card latching mechanism for releasably attaching the probe card to the ring carrier at a location in which the probe card engages the test head terminals and the wafer under test engages the probe card when at the test station.

12. A semiconductor tester according to claim 11, comprising a probe card stiffener on which the probe card rests, and wherein the probe card latching mechanism comprises a first part attached to the ring carrier and a second part attached to the probe card stiffener and releasably engageable with the first part.

13. A semiconductor tester according to claim 11, wherein the ring carrier support structure comprises equiangularly spaced support legs mounted on the wafer prober frame and wherein at least two of the support legs are adjustable in height.

14. A semiconductor tester according to claim 11, wherein the test head mounting structure rests on the ring carrier support structure.

* * * * *